United States Patent
Ikeda et al.

(10) Patent No.: US 12,354,868 B2
(45) Date of Patent: Jul. 8, 2025

(54) CLEANING METHOD, METHOD OF MANUFACTURING SEMICONDUCTOR DEVICE, RECORDING MEDIUM, AND SUBSTRATE PROCESSING APPARATUS

(71) Applicant: Kokusai Electric Corporation, Tokyo (JP)

(72) Inventors: Yuma Ikeda, Toyama (JP); Kazuki Nonomura, Toyama (JP); Kenichi Suzaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 18/089,190

(22) Filed: Dec. 27, 2022

(65) Prior Publication Data

US 2023/0223247 A1    Jul. 13, 2023

(30) Foreign Application Priority Data

Jan. 11, 2022   (JP) ................................ 2022-002098

(51) Int. Cl.
*H01L 21/02*    (2006.01)
*H01L 21/67*    (2006.01)

(52) U.S. Cl.
CPC .... *H01L 21/0206* (2013.01); *H01L 21/67017* (2013.01)

(58) Field of Classification Search
CPC ...................... H01L 21/0206; H01L 21/67017
See application file for complete search history.

(56) References Cited

U.S. PATENT DOCUMENTS

| | | | |
|---|---|---|---|
| 2004/0002220 A1 | 1/2004 | Mizushima | |
| 2004/0043721 A1 | 3/2004 | Imafuku et al. | |
| 2016/0362784 A1 | 12/2016 | Isobe et al. | |
| 2017/0260626 A1* | 9/2017 | Nagato | H01L 21/02164 |
| 2019/0127848 A1* | 5/2019 | Nagato | H01L 21/0228 |
| 2020/0407845 A1 | 12/2020 | Miyashita et al. | |
| 2021/0040609 A1 | 2/2021 | Harada et al. | |
| 2022/0403511 A1* | 12/2022 | Yamazaki | C23C 16/40 |

(Continued)

FOREIGN PATENT DOCUMENTS

| | | |
|---|---|---|
| CN | 111771263 A | 10/2020 |
| JP | 05-331630 A | 12/1993 |
| JP | 2003-077839 A | 3/2003 |

(Continued)

OTHER PUBLICATIONS

Taiwan Office Action issued on Sep. 6, 2023 for Taiwan Patent Application No. 111147541.

*Primary Examiner* — Sharidan Carrillo
(74) *Attorney, Agent, or Firm* — Volpe Koenig

(57) ABSTRACT

There is provided a technique that includes: (a) lowering a temperature in a process chamber supplied with a cleaning gas containing a halogen element while being heated to a first temperature, from the first temperature to a second temperature equal to or lower than a temperature at which substrate processing is performed in the process chamber, while vacuum-exhausting an inside of the process chamber; and (b) after (a), supplying a gas containing a water vapor into the process chamber while vacuum-exhausting the inside of the process chamber, to cause the halogen element remaining in the process chamber to react with the water vapor.

18 Claims, 8 Drawing Sheets

(56) References Cited

U.S. PATENT DOCUMENTS

2023/0223247 A1* 7/2023 Ikeda .................. C23C 16/4405
134/21

FOREIGN PATENT DOCUMENTS

| | | |
|---|---|---|
| JP | 2017-005090 A | 1/2017 |
| TW | 202120736 A | 6/2021 |
| WO | 02/49755 A1 | 6/2022 |

* cited by examiner

CLEANING METHOD, METHOD OF MANUFACTURING SEMICONDUCTOR DEVICE, RECORDING MEDIUM, AND SUBSTRATE PROCESSING APPARATUS

CROSS-REFERENCE TO RELATED APPLICATION

This application is based upon and claims the benefit of priority from Japanese Patent Application No. 2022-002098, filed on Jan. 11, 2022, the entire contents of which are incorporated herein by reference.

TECHNICAL FIELD

The present disclosure relates to a cleaning method, a method of manufacturing a semiconductor device, a recording medium, and a substrate processing apparatus.

BACKGROUND

A cleaning process may be performed in which after a process for forming a film on a substrate is performed, a cleaning gas is supplied into a process chamber to remove deposits adhering to the inside of the process chamber.

However, a halogen element may remain in a process chamber after a cleaning process is performed using a cleaning gas containing a halogen element. It takes a long time to purge the inside of the process chamber to remove the halogen element after the cleaning process.

SUMMARY

Some embodiments of the present disclosure provide a technique capable of reducing the amount of a halogen element remaining in a process chamber after a cleaning process in a short period of time while suppressing damage to members in the process chamber.

According to one embodiment of the present disclosure, there is provided a technique that includes: (a) lowering a temperature in a process chamber supplied with a cleaning gas containing a halogen element while being heated to a first temperature, from the first temperature to a second temperature equal to or lower than a temperature at which substrate processing is performed in the process chamber, while vacuum-exhausting an inside of the process chamber; and (b) after (a), supplying a gas containing a water vapor into the process chamber while vacuum-exhausting the inside of the process chamber, to cause the halogen element remaining in the process chamber to react with the water vapor.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
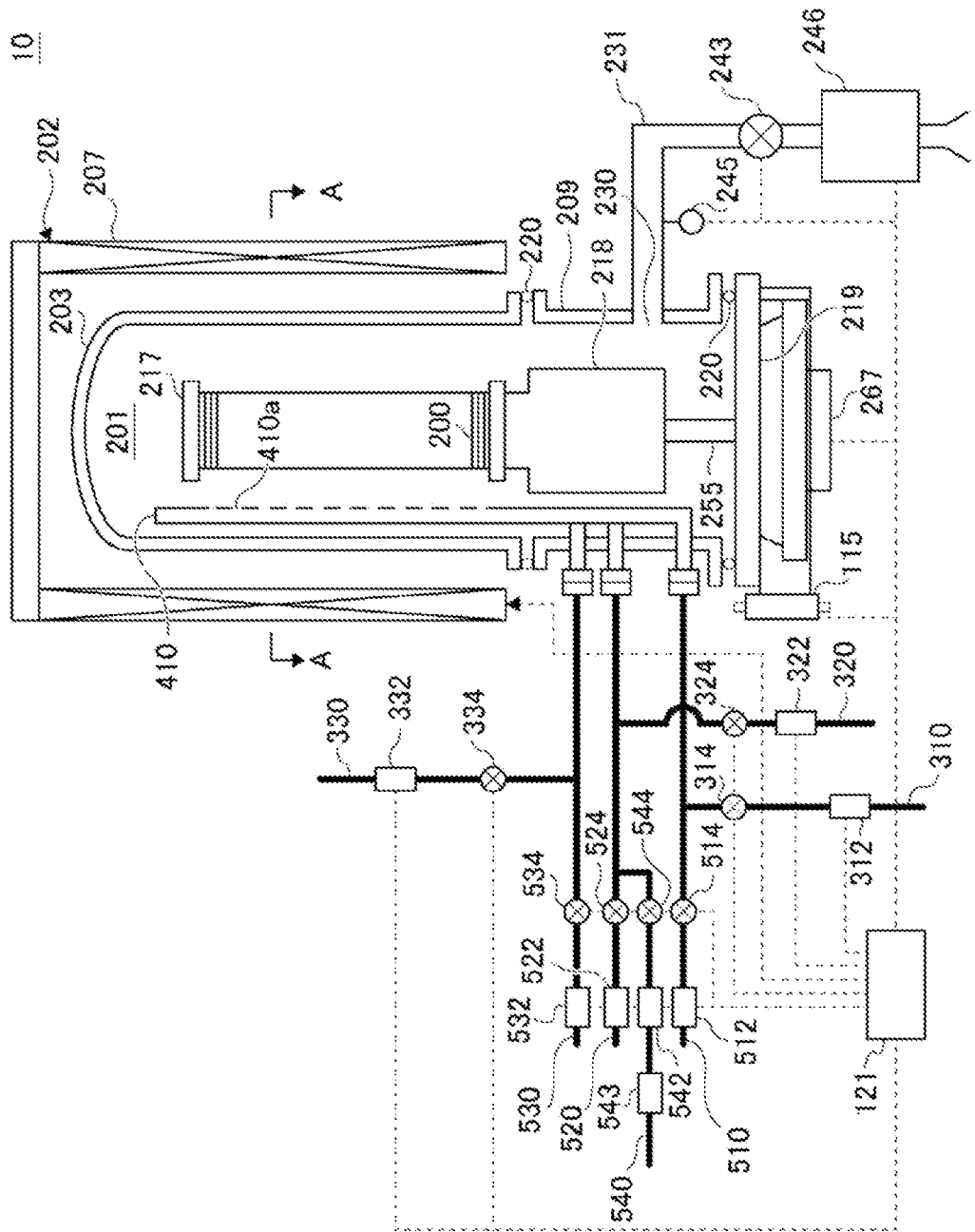
FIG. 1 is a diagram showing a schematic configuration example of a substrate processing apparatus according to one embodiment of the present disclosure, in which the portion of a process furnace is shown in a schematic vertical sectional view.
Figure 2:
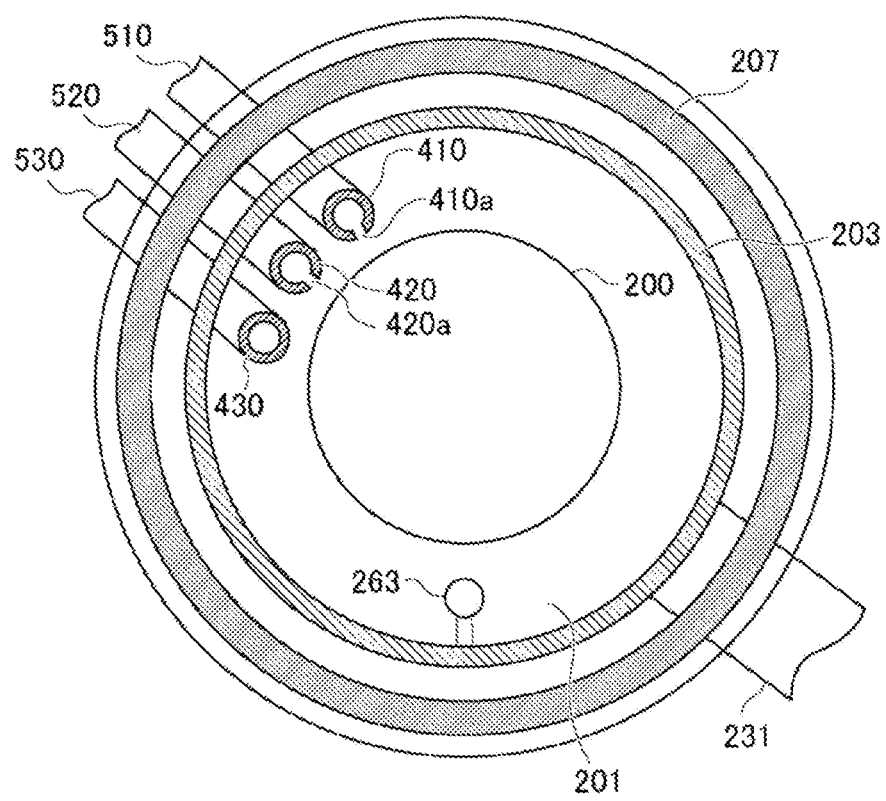
FIG. 2 is a schematic horizontal sectional view of the process furnace taken along line A-A in FIG. 1.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One Embodiment of the Present Disclosure

Hereinafter, one embodiment of the present disclosure will be described mainly with reference to FIGS. 1 to 5.

The drawings used in the following description are all schematic. The dimensional relationship between the respective elements, the ratio of the respective elements, and the like shown in the drawings do not necessarily match the actual ones. Moreover, the dimensional relationship between the respective elements, the ratio of the respective elements, and the like do not necessarily match between a plurality of drawings.

(1) Configuration of Substrate Processing Apparatus

As shown in FIG. 1, a process furnace 202 includes a heater 207 as a temperature controller (heating part). The heater 207 also functions as an activation mechanism (excitation part) that thermally activates (excites) a gas.

A reaction tube 203 is arranged concentrically with the heater 207 inside the heater 207. The reaction tube 203 is made of a heat-resistant material such as quartz ($SiO_2$) or silicon carbide (SiC), and has a cylindrical shape with a closed upper end and an open lower end.

Below the reaction tube 203, a seal cap 219 is provided as a furnace opening lid capable of hermetically closing the lower end opening of the reaction tube 203. A seal (hereinafter referred to as O-ring) 220 is arranged between an annular flange provided at the lower open end of the reaction tube 203 and the upper surface of the seal cap 219 to airtightly seal a gap therebetween. A process chamber 201 is formed by at least the reaction tube 203 and the seal cap 219. Wafers 200 as substrates are accommodated in the process chamber 201 where the wafers 200 are processed.

A boat support base 218 for supporting a boat 217 is provided on the seal cap 219.

The boat 217 as a substrate support is configured to support a plurality of wafers 200, for example, 25 to 200 wafers 200, in a horizontal posture and in multiple stages by arranging the wafers 200 in a vertical direction with their centers aligned with each other.

A boat rotation mechanism 267 for rotating the boat 217 is provided on the opposite side of the seal cap 219 from the process chamber 201.

The seal cap 219 is configured to be vertically moved up and down by a boat elevator 115 as an elevating mechanism provided outside the reaction tube 203.

The process furnace 202 described above is configured such that the boat 217 in which the wafers 200 are arranged is supported by the boat support base 218 and inserted into the process chamber 201.

Nozzles 410, 420 and 430 that are gas nozzles are provided in the process chamber 201. A gas supply pipe 510 is connected to the nozzle 410, a gas supply pipe 520 is connected to the nozzle 420, and a gas supply pipe 530 is connected to the nozzle 430.

On the gas supply pipes 510 to 530, mass flow controllers (MFCs) 512 to 532, which are flow rate controllers (flow rate control parts), and valves 514 to 534, which are opening/closing valves, are installed sequentially from an upstream side of a gas flow. A gas supply pipe 540 is connected to the gas supply pipe 520 on a downstream side of the valve 524 in the gas flow. On the gas supply pipe 540, a filter 543, an MFC 542 and a valve 544 are installed sequentially from the upstream side of the gas flow.

A gas supply pipe 310 is connected to the gas supply pipe 510 on a downstream side of the valve 514. Further, a gas supply pipe 320 is connected to the gas supply pipe 520 on a downstream of the connecting portion of the gas supply pipe 540. A gas supply pipe 330 is connected to the gas supply pipe 530 on a downstream side of the valve 534. On the gas supply pipes 310 to 330, MFCs 312 to 332 and valves 314 to 334 are installed sequentially from the upstream side of the gas flow.

The downstream ends of the gas supply pipes 510 to 530 are connected to the ends of the nozzles 410 to 430, respectively.

The nozzles 410 and 420 are installed in the cylindrical space between the inner wall of reaction tube 203 and the wafers 200 to extend along the inner wall of the reaction tube 203 from the lower portion to the upper portion. A large number of gas supply holes 410*a*, 420*a* for supplying processing gases are provided on the side surfaces of the nozzles 410 and 420, respectively.

The nozzle 430 is installed in the cylindrical space between the inner wall of the reaction tube 203 and the wafers 200 to extend along the inner wall of the reaction tube 203 from the lower portion to the upper portion. No gas supply hole for supplying processing gases is provided on the side surface of the nozzle 430. A gas supply hole 430*a* is formed at the top of the nozzle 430.

An exhaust port 230 is provided at a lower portion of the reaction tube 203. The exhaust port 230 is connected to an exhaust pipe 231.

From the gas supply pipe 510, a precursor gas containing a predetermined element, which is a processing gas and a film-forming gas, is supplied into the process chamber 201 via the MFC 512, the valve 514 and the nozzle 410.

From the gas supply pipe 520, an oxygen-containing gas containing oxygen (O), which is a processing gas, a film-forming gas, and a reaction gas that reacts with the precursor gas, is supplied into the process chamber 201 via the MFC 522, the valve 524 and the nozzle 420.

From the gas supply pipe 530, a cleaning gas containing a halogen element is supplied into the process chamber 201 via the MFC 532, the valve 534 and the nozzle 430.

From the gas supply pipe 540, atmospheric air (air), which is a gas containing water vapor, is supplied into the process chamber 201 via the filter 543, the MFC 542, the valve 544, the gas supply pipe 520 and the nozzle 420. The term "atmospheric air (air)" as used herein means, for example, the air in the substrate processing apparatus 10, the air in the clean room in which the substrate processing apparatus 10 is installed, the air taken in by the equipment inside or outside the facility in which the substrate processing apparatus 10 is installed, or the like.

From gas supply pipes 310 to 330, an inert gas is supplied into the process chamber 201 via the MFCs 312 to 332, the valves 314 to 334, the gas supply pipes 510 to 530, and the nozzles 410 to 430, respectively. The inert gas acts as a purge gas, a carrier gas, a dilution gas, and the like. As the inert gas, for example, a rare gas such as a nitrogen ($N_2$) gas, an argon (Ar) gas, a helium (He) gas, a neon (Ne) gas, a xenon (Xe) gas, or the like may be used. One or more of these gases may be used as the inert gas. This point also applies to the inert gas, which will be described later.

A precursor gas supply system is mainly composed of the gas supply pipe 510, the MFC 512 and the valve 514. A reaction gas supply system (also referred to as oxygen-containing gas supply system) is mainly composed of the gas supply pipe 520, the MFC 522 and the valve 524. A cleaning gas supply system (also referred to as halogen element-containing gas supply system) is mainly composed of the gas supply pipe 530, the MFC 532 and the valve 534. An atmospheric air supply system (also referred to as water vapor-containing gas supply system) is mainly composed of the gas supply pipe 540, the filter 543, the MFC 542 and the valve 544. An inert gas supply system is mainly composed of the gas supply pipes 310 to 330, the MFCs 312 to 332 and the valves 314 to 334. Further, the precursor gas supply system, the reaction gas supply system, the cleaning gas supply system, the atmospheric air supply system, and the inert gas supply system may be referred to as processing gas supply system. In addition, the nozzles 410, 420 and 430 may be included in the processing gas supply system.

A vacuum pump 246 as an evacuation device is connected to the exhaust pipe 231 via a pressure sensor 245 as a pressure detector (pressure detection part) for detecting the pressure in the process chamber 201 and an APC (Auto Pressure Controller) valve 243 as a pressure regulator (pressure regulation part). The APC valve 243 is configured to evacuate an inside of the process chamber 201 and stop the evacuation by being opened and closed while the vacuum pump 246 is in operation. Furthermore, the APC valve 243 is configured to adjust the pressure in the process chamber 201 by adjusting the valve opening degree thereof based on the pressure information detected by the pressure sensor 245 while the vacuum pump 246 is in operation. An exhaust system is mainly composed of the exhaust port 230, the exhaust pipe 231, the APC valve 243 and the pressure sensor 245. The vacuum pump 246 may be included in the exhaust system.

A temperature sensor 263 as a temperature detector is installed in the reaction tube 203. By adjusting the supply of electric power to the heater 207 based on the temperature information detected by the temperature sensor 263, the temperature inside the process chamber 201 can be set to a desired temperature distribution.

Figure 3:
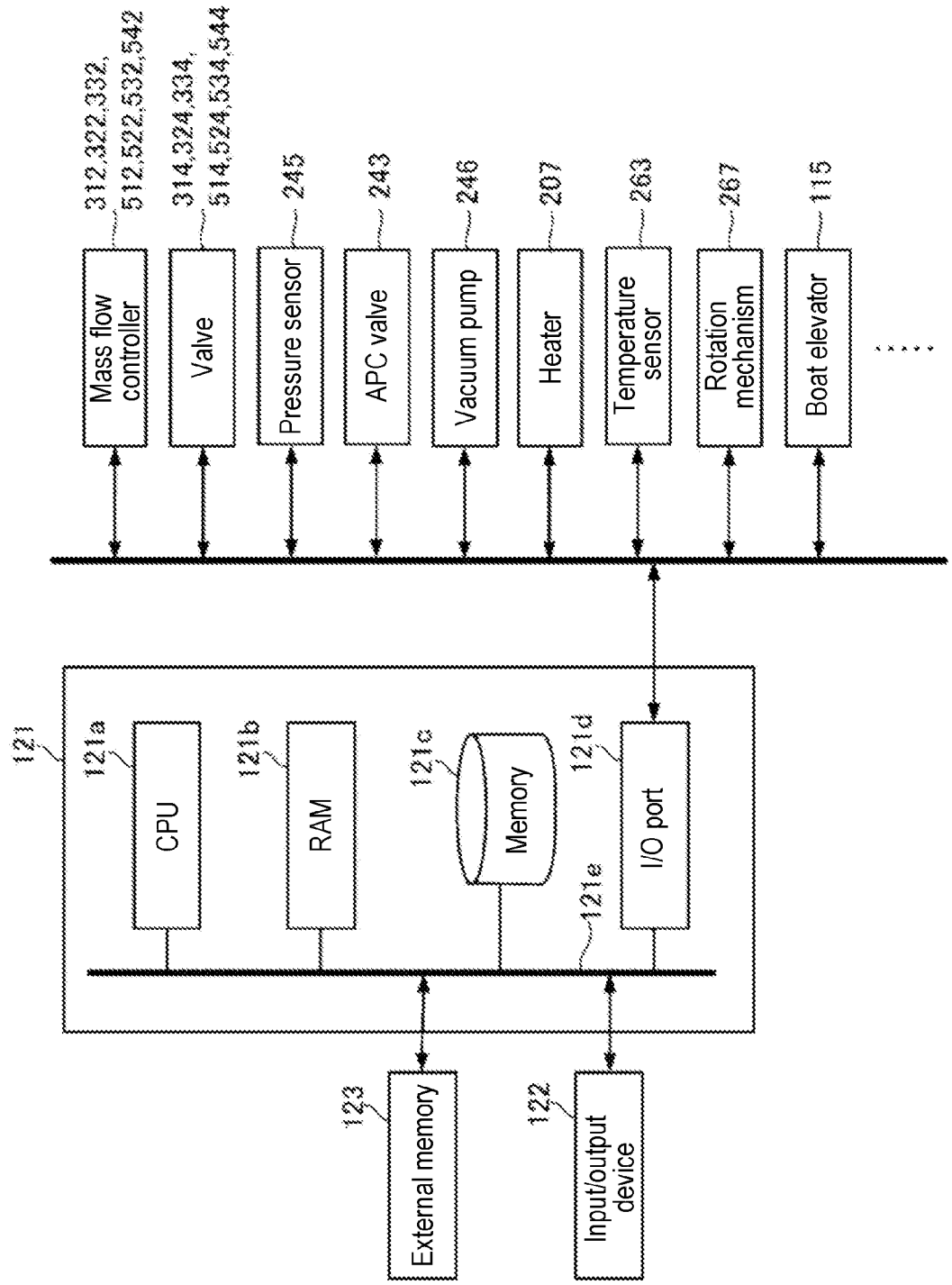
FIG. 3 is a block diagram for explaining the configuration of a control part of the substrate processing apparatus according to one embodiment of the present disclosure.

As shown in FIG. 3, the controller 121, which is a control part (control means), is configured as a computer including a CPU (Central Processing Unit) 121a, a RAM (Random Access Memory) 121b, a memory 121c and an I/O port 121d. The RAM 121b, the memory 121c and the I/O port 121d are configured to exchange data with the CPU 121a via an internal bus 121e. An input/output device 122 configured as, for example, a touch panel or the like is connected to the controller 121.

The memory 121c is composed of, for example, a flash memory, an HDD (Hard Disk Drive), an SSD (Solid State Drive), or the like. The memory 121c readably stores a control program for controlling the operation of the substrate processing apparatus, a process recipe describing procedures and conditions of a semiconductor device manufacturing method (substrate processing method and cleaning method) described later, and the like. The process recipe is a combination that allows the controller 121 to execute each process (each step) in a below-described semiconductor device manufacturing method (substrate processing method and cleaning method) to obtain a predetermined result. The process recipe functions as a program. Hereinafter, the process recipe, the control program, and the like are collectively and simply referred to as program. The process recipe is also simply referred to as recipe. When the term "program" is used in this specification, it may include a recipe, a control program, or both. The RAM 121b is configured as a memory area (work area) in which programs and data read by the CPU 121a are temporarily held.

The I/O port 121d is connected to the MFCs 312 to 332 and 512 to 542, the valves 314 to 334 and 514 to 544, the pressure sensor 245, the APC valve 243, the vacuum pump 246, the heater 207, the temperature sensor 263, the rotation mechanism 267, the boat elevator 115, and the like.

The CPU 121a is configured to read a control program from the memory 121c and execute the same, and to read a recipe from the memory 121c in response to the input of an operation command from the input/output device 122, and the like. The CPU 121a is configured to be capable of, according to the recipe thus read, controlling the flow rate adjustment operation for various gases by the MFCs 312 to 332 and 512 to 542, the opening/closing operation of the valves 314 to 334 and 514 to 544, the opening/closing operation of the APC valve 243, the pressure regulation operation by the APC valve 243 based on pressure sensor 245, the startup and stop of the vacuum pump 246, the temperature adjustment operation of the heater 207 based on the temperature sensor 263, the rotation and rotation speed adjustment operation for the boat 217 by the rotation mechanism 267, the elevating operation of the boat 217 by the boat elevator 115, and the like.

The controller 121 can be configured by installing the above-described program stored in an external memory 123 into a computer. The external memory 123 includes, for example, a magnetic disk such as an HDD, an optical disk such as a CD, a magneto-optical disk such as an MO, a USB memory, a semiconductor memory such as an SSD, and the like. The memory 121c and the external memory 123 are configured as computer-readable recording media. Hereinafter, these are also collectively and simply referred to as recording medium. When the term "recording medium" is used in this specification, it may include the memory 121c, the external memory 123, or both of them. The program may be provided to the computer using a communication means such as the Internet or a dedicated line without having to use the external memory 123.

(2) Substrate Processing Process

Figure 4:
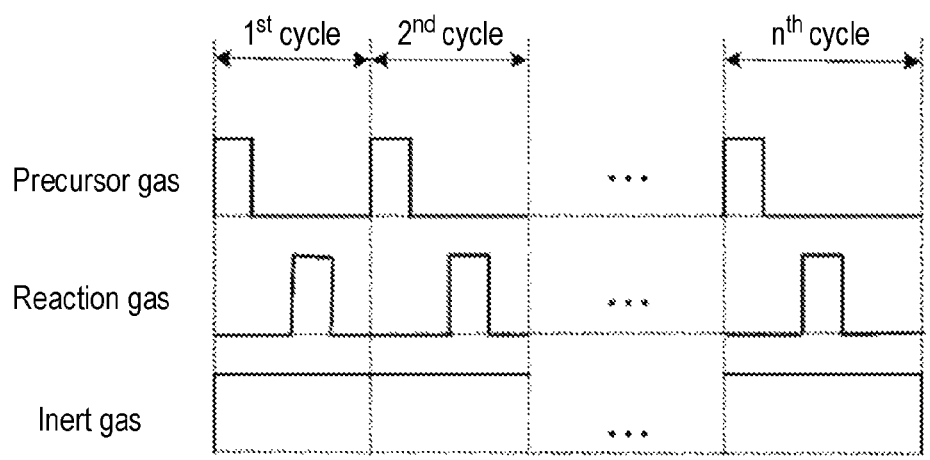
FIG. 4 is a diagram showing a gas supply timing in a substrate processing process according to one embodiment of the present disclosure.

Next, as a process for manufacturing a semiconductor device according to the present embodiment, an example of a method of manufacturing a semiconductor device by forming a predetermined film on a wafer using the above-described substrate processing apparatus 10 will be described with reference to FIG. 4. In the following description, the operation of each part of the substrate processing apparatus 10 is controlled by the controller 121.

The term "wafer" used herein may refer to "a wafer itself" or "a stacked body of a wafer and a predetermined layer or film formed on the surface of the wafer (That is, the wafer including a predetermined layer or film formed on the surface thereof may be referred to as wafer)." The phrase "a surface of a wafer" used herein may refer to "a surface of a wafer itself" or "a surface of a predetermined layer or the like formed on a wafer, i.e., an outermost surface of a wafer as a stacked body." The term "substrate" used herein is synonymous with the term "wafer."

(Wafer Loading)

A plurality of wafers 200 is loaded into the process chamber 201 (boat loading). Specifically, when a plurality of wafers 200 is charged to the boat 217 (wafer charging), as shown in FIG. 1, the boat 217 supporting the wafers 200 is lifted by the boat elevator 115 and loaded into the process chamber 201. In this state, the seal cap 219 closes the lower end opening of a manifold 209 with the O-ring 220 interposed therebetween.

(Pressure Regulation and Temperature Adjustment)

The inside of the process chamber 201 is evacuated by the vacuum pump 246 so as to have a desired pressure (degree of vacuum). At this time, the pressure in the process chamber 201 is measured by the pressure sensor 245, and the APC valve 243 is feedback-controlled based on the measured pressure information (pressure regulation). Further, the inside of the process chamber 201 is heated by the heater 207 so as to reach a desired temperature. At this time, the amount of electric power supplied to the heater 207 is feedback-controlled based on the temperature information detected by the temperature sensor 263 so that the inside of the process chamber 201 has a desired temperature distribution (temperature adjustment).

Further, the boat 217 and the wafers 200 are rotated by the rotation mechanism 267.

(Film-Forming Process)

Thereafter, a precursor gas supply step, a residual gas removal step, a reaction gas supply step, and a residual gas removal step are performed a predetermined number of times in the named order.

(Precursor Gas Supply Step)

The valve 514 is opened to allow a precursor gas to flow into the gas supply pipe 510. The precursor gas is supplied into the process chamber 201 after the flow rate thereof is adjusted by the MFC 512. At the same time, the valve 314 is opened to allow an inert gas to flow through the gas supply pipe 310. The flow rate of the inert gas is adjusted by the MFC 312. The inert gas is supplied into the process chamber 201 with the precursor gas, and is exhausted from the exhaust pipe 231. Furthermore, in order to prevent the precursor gas from entering the gas supply pipes 520 and 530 (backflow prevention), the valves 324 and 334 are opened to allow the inert gas to flow into the gas supply pipes 320 and 330. The inert gas is supplied to the process chamber 201 through the gas supply pipes 320 and 330 and exhausted from the exhaust pipe 231.

At this time, the APC valve 243 is adjusted appropriately to set the pressure in the process chamber 201 a pressure in a range of, for example, 1 to 1000 Pa, preferably 1 to 100 Pa, and more preferably 10 to 50 Pa. In addition, the expression of a numerical range such as "1 to 1000 Pa" in this specification means that the lower limit and upper limit are included in the range. Therefore, for example, "1 to 1000 Pa" means "1 Pa or more and 1000 Pa or less". The same applies to other numerical ranges.

The supply flow rate of the precursor gas controlled by the MFC 512 is set to a flow rate in a range of, for example, 10 to 2000 sccm, preferably 50 to 1000 sccm, and more preferably 100 to 500 sccm.

The supply flow rate of the inert gas controlled by the MFC 312 is set to a flow rate in a range of, for example, 1 to 30 slm. The time for which the precursor gas is supplied to the wafers 200 is set to a time in a range of, for example, 1 to 60 seconds, preferably 1 to 20 seconds, and more preferably 2 to 15 seconds.

The heater 207 heats the wafers 200 to a process temperature in a range of, for example, room temperature to 350 degrees C., preferably 150 degrees C. to 250 degrees C.

As the precursor gas, for example, an Al-containing precursor gas (Al-containing precursor or Al-containing gas), which is a metal-containing gas and which contains aluminum (Al) as a predetermined element, is used. As the Al-containing precursor gas, for example, a halogen-based Al-containing gas such as aluminum chloride ($AlCl_3$) gas, or an organic Al-containing gas such as trimethylaluminum (($CH_3$)$_3$Al, TMA) gas may be used.

A first layer is formed on the outermost surface of the wafer 200 by supplying the precursor gas to the process chamber 201 under the above-described conditions. For example, when an Al-containing gas is used as the precursor gas, an Al-containing layer is formed as the first layer. The Al-containing layer may be an adsorption layer (a physical adsorption layer or a chemical adsorption layer) obtained by decomposing an Al-containing gas or a part of an Al-containing gas, or may be an Al deposition layer (Al layer).

[Residual Gas Removal Step]

Next, the valve 514 is closed to stop the supply of the precursor gas. At this time, while keeping the APC valve 243 opened, the inside of the process chamber 201 is evacuated by the vacuum pump 246 to remove the precursor gas unreacted or contributed to layer formation, which remains in the process chamber 201. The valves 314, 324 and 334 are kept opened to maintain the supply of the inert gas into the process chamber 201.

[Reaction Gas Supply Step]

After removing the residual gas in the process chamber 201, the valve 524 is opened to allow a reaction gas to flow through the gas supply pipe 520. The flow rate of the reaction gas is adjusted by the MFC 522. The reaction gas is supplied to the wafers 200 in the process chamber 201 through the gas supply pipe 520 and exhausted from the exhaust pipe 231. That is, the wafers 200 are exposed to the reaction gas.

At this time, the valve 324 is opened to allow an inert gas to flow through the gas supply pipe 320. The flow rate of the inert gas is adjusted by the MFC 322. The inert gas is supplied into the process chamber 201 with the reaction gas, and is exhausted from the exhaust pipe 231. At this time, the valves 314 and 334 are opened to allow an inert gas to flow into the gas supply pipes 310 and 330 in order to prevent the reaction gas from entering the gas supply pipes 510 and 530 (backflow prevention). The inert gas is supplied into the process chamber 201 via the gas supply pipes 310 and 510 and the gas supply pipes 330 and 530 and exhausted from the exhaust pipe 231.

At this time, the APC valve 243 is adjusted appropriately to set the pressure in the process chamber 201 to a pressure in a range of, for example, 1 to 1000 Pa. The supply flow rate of the reaction gas controlled by the MFC 522 is set to a flow rate in a range of, for example, 5 to 40 slm, preferably 5 to 30 slm, and more preferably 10 to 20 slm. The time for which the reaction gas is supplied to the wafers 200 is set to a time in a range of, for example, 1 to 60 seconds. Other processing conditions are the same as those of the precursor gas supply step described above.

As the reaction gas, a gas that reacts with the precursor gas, for example, an oxygen-containing gas, is used. Examples of the oxygen-containing gas include oxygen (O)-containing gases such as an oxygen ($O_2$) gas, an ozone ($O_3$) gas, a plasma-excited $O_2$ ($O_2^*$) gas, $O_2$ gas+hydrogen ($H_2$) gas, a water vapor ($H_2O$ gas), a hydrogen peroxide ($H_2O_2$) gas, a nitrous oxide ($N_2O$) gas, a nitric oxide (NO) gas, a nitrogen dioxide ($NO_2$) gas, a carbon monoxide (CO) gas, a carbon dioxide ($CO_2$) gas, and the like. One or more of these gases may be used as the oxygen-containing gas.

At this time, the gases flowing into the process chamber 201 are the reaction gas and the inert gas. The reaction gas reacts with at least part of the first layer formed on the wafer 200 in the precursor gas supply step. That is, the Al-containing layer as the first layer formed in the precursor gas supply step is oxidized to form an aluminum oxide layer (AlO layer) containing Al and O as a metal oxide layer which is a second layer. That is, the Al-containing layer is modified into an AlO layer.

[Residual Gas Removal Step]

Next, the valve 524 is closed to stop the supply of the reaction gas. Then, the reaction gas unreacted or contributed to the formation of the second layer and the reaction byproducts, which remain in the process chamber 201, are removed from the inside of the process chamber 201 by the same processing procedure as that of the residual gas removal step performed after the precursor gas supply step.

By performing a cycle of sequentially performing the precursor gas supply step, the residual gas removal step, the reaction gas supply step, and the residual gas removal step a predetermined number of times (one or more times, n times), a predetermined film is formed on the wafer 200. An aluminum oxide film (AlO film) is formed on the wafer 200 as a film containing Al and O, for example.

(After-Purging and Atmospheric Pressure Restoration)

An inert gas is supplied into the process chamber 201 from each of the gas supply pipes 310, 320 and 330 and exhausted from the exhaust pipe 231. The inert gas acts as a purge gas, whereby the inside of the process chamber 201 is purged with the inert gas, and the gas and by-products remaining in the process chamber 201 are removed from the inside of the process chamber 201 (after-purging). Thereafter, the atmosphere in the process chamber 201 is replaced with the inert gas (inert gas replacement), and the pressure in the process chamber 201 is returned to the atmospheric pressure (atmospheric pressure restoration). As used herein, the term "atmospheric pressure" may mean, for example, the pressure in a clean room where the substrate processing apparatus 10 is installed, the pressure inside or outside the facility where the substrate processing apparatus 10 is installed, the pressure inside the housing of the substrate processing apparatus 10, and the pressure outside the process chamber 201. That is, the term "atmospheric pressure" used herein may include the pressure fluctuation caused by the circulation of the atmosphere inside the housing or outside the process chamber 201, or the slight pressure increase or slight pressure decrease performed to suppress the inflow of particles. In the following description, the atmospheric pressure is described as the pressure outside the process chamber 201.

(Wafer Unloading)

Thereafter, the seal cap 219 is lowered by the boat elevator 115 to open the lower end of the manifold 209. Then, the processed wafers 200 on which a predetermined film is formed are unloaded from the lower end of the reaction tube 203 to the outside of the reaction tube 203 while being supported by the boat 217 (boat unloading). Thereafter, the processed wafers 200 are taken out from the boat 217 (wafer discharging).

When the above-described film-forming process is performed, the film adheres to and deposits on an inner wall of the reaction tube 203, surfaces of the nozzles 410, 420 and 430, an inner wall of the manifold 209, a surface of the boat 217, an upper surface of the seal cap 219, a surface of the boat support base 218, and the like. The deposits deposited in the process chamber 201 in this manner may generate particles (foreign substances) in a subsequent film-forming process and may lead to deterioration in the quality of films and devices formed on the wafer 200. Therefore, in the method of manufacturing a semiconductor device according to the present embodiment, a cleaning process, which will be described later, is performed before the cumulative film thickness of the films deposited in the process chamber 201 reaches a predetermined film thickness before peeling or dropping occurs.

(3) Cleaning Process

Figure 5:
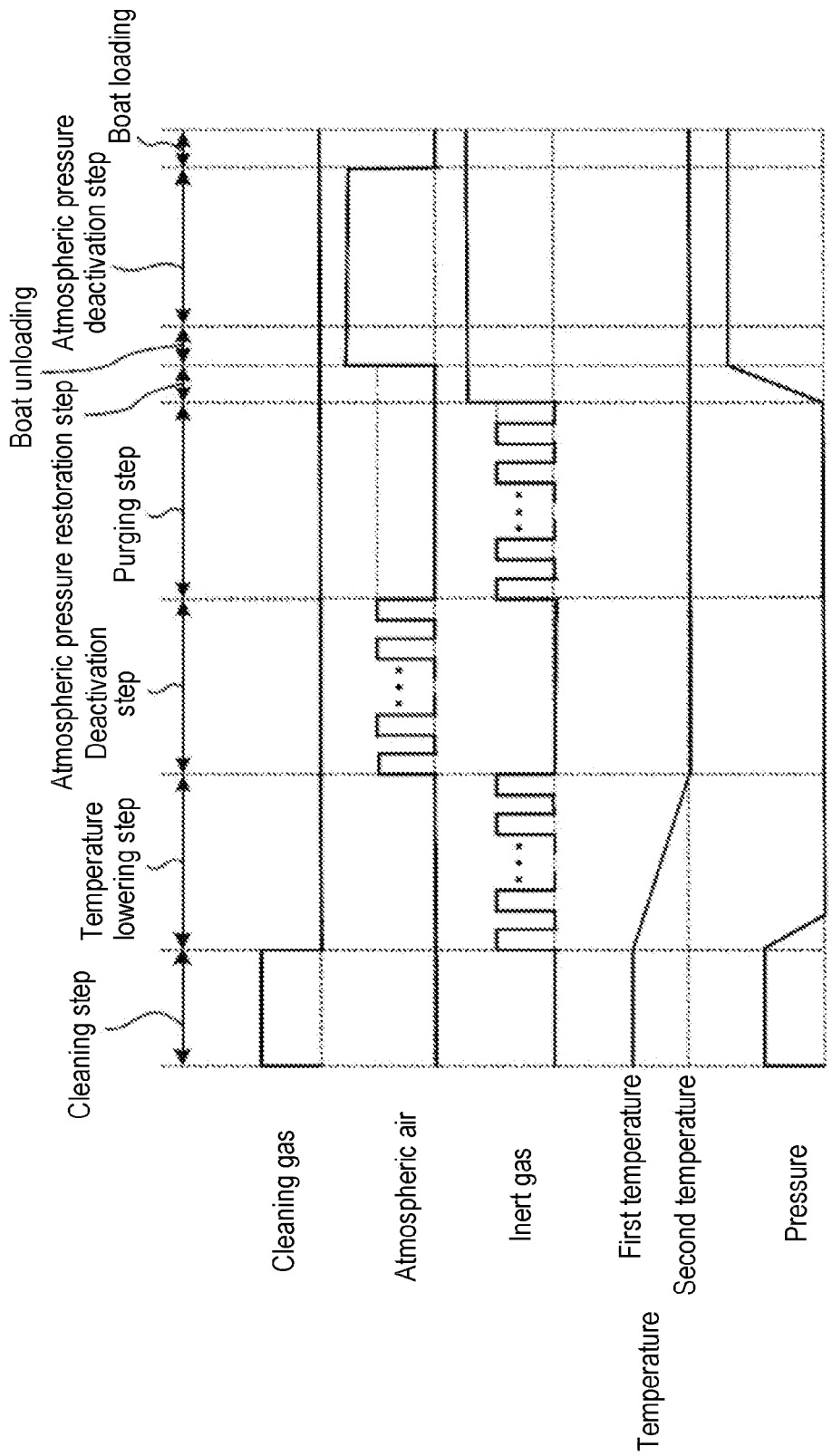
FIG. 5 is a diagram illustrating a gas supply timing, a temperature change in a process chamber, and a pressure change in a process chamber in a cleaning process according to one embodiment of the present disclosure.

A process (cleaning process) for etching deposits such as films adhered to the inner wall of the reaction tube 203 in the film-forming process will be described below with reference to FIG. 5.

(Boat Loading)

An empty boat 217, i.e., a boat 217 not loaded with the wafers 200 is lifted by the boat elevator 115 and loaded into the process chamber 201. In this state, the seal cap 219 seals the lower end of the manifold 209 with the O-ring 220 interposed therebetween.

(Pressure Regulation and Temperature Adjustment)

The inside of the process chamber 201 is evacuated (exhausted or depressurized) by the vacuum pump 246 so as to have a predetermined cleaning pressure (etching pressure), which will be described later. The vacuum pump 246 is constantly kept in an operating state at least until an atmospheric pressure restoration step, which will be described later, is started. Further, the inside of the process chamber 201 is heated by the heater 207 so as to reach a predetermined cleaning temperature (etching temperature), which will be described later.

(Cleaning Step)

In this step, a cleaning gas is supplied into the process chamber 201 in which the film-forming process has been performed on the wafers 200, i.e., the process chamber 201 to which the deposits have adhered. That is, the valve 534 is opened to allow the cleaning gas to flow through the gas supply pipe 530. The flow rate of the cleaning gas is adjusted by the MFC 532. The cleaning gas is supplied into the process chamber 201 through the gas supply pipe 530 and the nozzle 430. An inert gas is supplied into the process chamber 201 through the gas supply pipes 510 and 520 and the nozzles 410 and 420 and exhausted from the exhaust pipe 231.

As the cleaning gas, for example, a gas containing a halogen element, which includes at least one selected from the group consisting of silicon tetrachloride ($SiCl_4$), hydrogen chloride (HCl), boron trichloride ($BCl_3$), chlorine ($Cl_2$), fluorine ($F_2$), hydrogen fluoride (HF), silicon tetrafluoride ($SiF_4$), nitrogen trifluoride ($NF_3$), chlorine trifluoride ($ClF_3$), boron tribromide ($BBr_3$), silicon tetrabromide ($SiBr_4$) and bromine ($Br_2$), may be used.

When the cleaning gas supplied into the process chamber 201 is exhausted from the exhaust pipe 231 through the process chamber 201, the cleaning gas comes into contact with surfaces of the members in the process chamber 201 such as, for example, the inner wall of the reaction tube 203, the surfaces of the nozzles 410, 420 and 430, the inner wall of the manifold 209, the surface of the boat 217, the upper surface of the seal cap 219, the surface of the boat support base 218, and the like. At this time, the deposits such as films adhering to the members in the process chamber 201 are removed by a thermochemical reaction. That is, the etching reaction between the cleaning gas and the deposits causes the cleaning gas to react with at least part of the deposits deposited (adhered) inside the process chamber 201, whereby the deposits are removed from the inside of the process chamber 201.

For example, when a Cl-containing gas is used as the cleaning gas, Al contained in, for example, the AlO film deposited in the process chamber 201 is bonded to Cl contained in the cleaning gas by supplying the Cl-containing gas, whereby aluminum chloride ($AlCl_3$) or the like is generated in the process chamber 201. In other words, at least a part of the AlO film adhering to the inside of the process chamber 201 reacts with the Cl-containing gas, which makes it possible to proceed the etching reaction of the deposits and remove the deposits from the inside of the process chamber 201. In this way, by supplying the Cl-containing gas into the process chamber 201 to which the deposits including the O-containing film adheres, it is possible to proceed the etching reaction of the deposits in a non-plasma atmosphere.

At this time, the heater 207 is controlled by the controller 121 to activate the cleaning gas in a state in which the inside of the process chamber 201 is heated to a first temperature, which is a cleaning temperature, for example, 600 degrees C. which is a predetermined temperature in a range of, for example, 400 to 800 degrees C., preferably 600 to 800 degrees C. The process temperature in this step is higher than the process temperature in the precursor gas supply step and the reaction gas supply step of the film-forming process in the substrate processing process. The process temperature means the temperature of the wafer 200 in the substrate processing process, and means the temperature in the process chamber 201 in the cleaning process.

At this time, the APC valve 243 is closed, or substantially closed to such an extent that it does not affect the process to confine the cleaning gas within the process chamber 201. Then, the pressure in the process chamber 201 is maintained at a predetermined pressure in a range of, for example, 1 to 40000 Pa, preferably 10000 to 30000 Pa, more preferably 20000 to 30000 Pa.

At this time, the supply flow rate of the cleaning gas controlled by the MFC 532 is set to a predetermined flow rate in the range of, for example, 1 to 10 slm, preferably 3 to 8 slm.

The time during which the cleaning gas is supplied to the process chamber 201 is set to a predetermined time in a range of, for example, 60 to 600 seconds.

When the cleaning process is performed using a cleaning gas containing a halogen element, the halogen element contained in the by-products (e.g., $AlCl_3$, etc.) generated by the reaction between the cleaning gas and the deposits, the unreacted cleaning gas (residual gas), and the like may remain in the process chamber 201. If the film-forming process is performed by loading the wafers 200 into the process chamber 201 in which the halogen element remains, the halogen element may become a factor that inhibits the film formation, or may enter the film. Further, when purging is performed with an inert gas after the cleaning process, purging for a long time should be performed in order to remove the halogen element from the process chamber 201, which may reduce the throughput of the apparatus. Therefore, in the present embodiment, following the cleaning step and the below-described purging step using an inert gas, a deactivation step, which will be described later, is further performed in order to efficiently remove the halogen element remaining in the process chamber 201 from the inside of the process chamber 201.

(Temperature Lowering Step (Inert Gas Purging Step))

After supplying the cleaning gas for a predetermined time, the valve 534 is closed to stop the supply of the cleaning gas. At this time, while the APC valve 243 on the exhaust pipe 231 is opened and the inside of the process chamber 201 is evacuated by the vacuum pump 246, the temperature in the process chamber 201 is lowered from 600 degrees C., which is the first temperature and the cleaning temperature, to, for example, 200 degrees C., which is a second temperature and a temperature equal to or lower than the temperature (process temperature) at which the substrate processing process is performed in the process chamber 201 (temperature lowering). This is because, if the subsequent deactivation step is performed while the inside of the process chamber 201 is kept at, for example, 600 degrees C., which is the cleaning temperature, or higher, the reaction between the halogen element remaining in the process chamber 201 and the deactivation gas may proceed rapidly, and the by-product gas, which is a corrosive gas, may be generated in a large amount.

That is, after the supply of the cleaning gas is stopped, from the start of the temperature lowering step to the end of the temperature lowering step, i.e., from the end of the cleaning step to the start of the subsequent deactivation step, the temperature in the process chamber 201 is lowered from the cleaning temperature (first temperature) to a predetermined temperature equal to or lower than the process temperature (second temperature). Thus, after the cleaning gas is supplied, the temperature in the process chamber 201 is lowered from the cleaning temperature to the process temperature or lower.

Furthermore, in this step, the inside of the process chamber 201 is purged by supplying an inert gas into the process chamber 201 while vacuum-exhausting the inside of the process chamber 201. As a result, at least a part of the by-products and residual gas remaining in the process chamber 201 in the cleaning step can be removed from the process chamber 201. At this time, by controlling at least one, preferably all, of the valves 314, 324 and 334, the step of supplying the inert gas into the process chamber 201 and the step of stopping the supply of the inert gas are alternately performed. That is, the cycle of supplying the inert gas and stopping the supply of the inert gas is performed a predetermined number of times while the temperature in the process chamber 201 is lowered to a predetermined temperature equal to or lower than the process temperature. That is, the inside of the process chamber 201 is cycle-purged with the inert gas while lowering the temperature in the process chamber 201. In other words, while purging the inside of the process chamber 201 by intermittently supplying the inert gas into the process chamber 201, the temperature in the process chamber 201 is lowered to a predetermined temperature equal to or lower than the process temperature. Alternately repeating the supply and stop of the gas in this manner, i.e., performing the supply and stop of the gas a plurality of times is also referred to as cycle purge or cyclic purge in this specification. The present disclosure is not limited to the cycle purge using the inert gas. Continuous flow purge may be performed by continuously supplying the inert gas while lowering the temperature in the process chamber 201 to a predetermined temperature equal to or lower than the process temperature.

At this time, the supply flow rate of the inert gas controlled by the MFCs 314, 324 and 334 is, for example, a predetermined flow rate in a range of 0.5 to 30 slm. If the flow rate is more than 30 slm, it may be difficult to maintain the pressure in the process chamber 201 at or below a predetermined pressure. If the flow rate is less than 0.5 slm, the residual gas containing a halogen element may not be sufficiently removed.

At this time, the pressure in the process chamber 201 is maintained at a predetermined pressure lower than the pressure in the process chamber 201 in the cleaning step, for example, a predetermined pressure of 1 to 30000 Pa. If the pressure is higher than 30000 Pa, the residual gas may not be sufficiently removed, and if the pressure is lower than 1 Pa, it may be difficult to keep the pressure in the process chamber 201 at or below the predetermined pressure.

In this step, the residues containing a halogen element, such as the cleaning gas and the by-products, which remain in the process chamber 201, are removed from the process chamber 201. Therefore, the amount of the halogen element remaining in the process chamber 201 can be reduced before performing the subsequent deactivation step. In addition, the amount of the corrosive by-product gas produced by the subsequent deactivation step can be reduced.

(Deactivation Step)

After the inside of the process chamber 201 is lowered to the process temperature (second temperature) (temperature lowering), the valves 314, 324 and 334 are closed to stop the supply of the inert gas while the temperature in the process chamber 201 is maintained at the process temperature. At this time, while the APC valve 243 on the exhaust pipe 231 is kept opened and the inside of the process chamber 201 is evacuated by the vacuum pump 246, the atmospheric air, which is a gas containing water vapor as a deactivating gas, is supplied into the process chamber 201. The pressure in the process chamber 201, which is adjusted by the APC valve 243, is preferably equal to that in the temperature lowering step.

That is, by controlling the opening and closing of the valve 544, the step of supplying the atmospheric air into the process chamber 201 and the step of stopping the supply of atmospheric air are alternately performed a predetermined number of times. That is, a cycle of supplying the atmospheric air and stopping the supply of the atmospheric air is performed a plurality of times. That is, cycle purging is performed by the atmospheric air. In other words, the atmospheric air is intermittently supplied into the process chamber 201.

Foreign substances are removed from the atmospheric air by the filter 543. The flow rate of the atmospheric air is adjusted by the MFC 542. The atmospheric air is supplied into the process chamber 201 from the nozzle 420 provided in the process chamber 201, and is exhausted from the exhaust pipe 231. That is, the atmospheric air is introduced into the process chamber 201 via the filter 543, the gas supply pipe 520 and the nozzle 420. As a result, the water vapor contained in the atmospheric air introduced into the process chamber 201 reacts with the halogen element remaining in the process chamber 201 to deactivate the halogen element. By this reaction, a by-product gas is generated that contains at least one selected from the group consisting of HCl, HF and hydrogen bromide (HBr) which are composed of molecules containing a halogen element and hydrogen. By using the atmospheric air as the gas containing a water vapor, the gas containing water at a predetermined concentration can be easily introduced into the process chamber 201 at a large flow rate. Therefore, the halogen element can be deactivated in a short time, and the amount of the halogen element remaining in the process chamber 201 can be reduced. In addition, by supplying the atmospheric air from the nozzle 420, the atmospheric air can be supplied substantially uniformly to the entire space in the process chamber 201.

By cycle-purging the inside of the process chamber 201 with the atmospheric air in this way, the reaction between the halogen element remaining in the process chamber 201 and the water vapor contained in the atmospheric air, and the removal of the by-product gas generated by this reaction, can be performed more efficiently. The present disclosure is not limited to the cycle purging with the atmospheric air. Continuous flow purging may be performed in which the atmospheric air is continuously supplied for a predetermined period of time.

At this time, the supply flow rate of the atmospheric air controlled by the MFC 542 is a predetermined flow rate in a range of, for example, 0.5 to 30 slm. If the flow rate is more than 30 slm, it may be difficult to maintain the pressure in the process chamber 201 at or below the predetermined pressure. If the flow rate is less than 0.5 slm, the deactivation may not be performed substantially. In addition, simultaneously with the supply of the atmospheric air, an inert gas may be supplied into the process chamber 201 through the nozzle 420 and/or at least one of the nozzles 410 and 430. By simultaneously supplying the inert gas in this way, it becomes easy to adjust the concentration of the atmospheric air (or water vapor) in the process chamber 201.

If the halogen element remaining in the process chamber 201 is reacted (deactivated) with a water vapor in a high temperature state immediately after the cleaning process, a corrosive by-product gas such as HCl, HF, HBr or the like may be rapidly generated. As a result, quartz members in the process chamber 201 may be etched, or metal members may be corroded. In the present disclosure, after the temperature in the process chamber 201 is lowered to the process temperature or lower after supplying the cleaning gas, the halogen element remaining in the process chamber 201 is caused to react (deactivate) with the water vapor contained in the atmospheric air. As a result, the generation of the by-product gas can be reduced to suppress the etching of the quartz member and the corrosion of the metal member. In addition, by deactivating the halogen element remaining in the process chamber 201 with the water vapor, it is possible to reduce the halogen element in a short time as compared with a case where the purging is performed with an inert gas. This makes it possible to remove the halogen element more efficiently.

That is, in the temperature lowering step, the supply of the atmospheric air containing a water vapor into the process chamber 201 is not performed, and cycle purging is performed with an inert gas during the temperature lowering. Then, after the temperature in the process chamber 201 is lowered from the cleaning temperature to the process temperature, a deactivation step is performed to cycle-purge the process chamber 201 with the atmospheric air. Before performing the deactivation step, by stopping the supply of the atmospheric air until the temperature in the process chamber 201 is lowered to the process temperature, it is possible to suppress the rapid generation of a corrosive by-product gas otherwise generated by the reaction of the halogen element and the water vapor. Accordingly, it is possible to suppress the corrosion of metal members, and the like.

When the oxygen-containing gas is used in the substrate processing step as described above, the atmospheric air is preferably supplied into the process chamber 201 through the gas supply pipe 520 and the gas nozzle 420 which are used for supplying the oxygen-containing gas. This eliminates the need for a dedicated nozzle for introducing the atmospheric air, which makes it possible to reduce the number of ports.

(Purging Step)

Next, the valve 544 is closed to stop the supply of the atmospheric air while maintaining the inside of the process chamber 201 at the process temperature or lower. At this time, the inside of the process chamber 201 is purged by supplying an inert gas into the process chamber 201 while vacuum-exhausting the inside of the process chamber 201 with the vacuum pump 246 by opening the APC valve 243 on the exhaust pipe 231.

At this time, by controlling at least one, preferably all, of the valves 314, 324 and 334, the step of supplying the inert gas into the process chamber 201 and the step of stopping the supply of the inert gas are alternately performed a predetermined number of times. That is, a cycle of supplying the inert gas and stopping the supply of the inert gas is performed a plurality of times. That is, cycle of purging is performed with the inert gas. In other words, the inside of the process chamber 201 is purged while the inert gas is intermittently supplied into the process chamber 201.

As a result, the by-product gas generated in the deactivation step can be removed from the process chamber 201 before the process chamber 201 is opened at the time of boat unloading which will be described later. Further, by cyclically purging the inside of the process chamber 201 with the inert gas, the by-product gas can be removed more efficiently. The present disclosure is not limited to the case where the cycle purging is performed with the inert gas. Continuous flow purging may be performed in which the inert gas is continuously supplied for a predetermined time while maintaining the inside of the process chamber 201 at the second temperature.

At this time, the supply flow rate of the inert gas controlled by the MFCs 314, 324 and 334 is a predetermined flow rate in a range of, for example, 0.5 to 30 slm. If the flow rate is more than 30 slm, it may be difficult to maintain the pressure in the process chamber 201 at or below the predetermined pressure. If the flow rate is less than 0.5 slm, the by-product gas may not be sufficiently removed.

In this step, the supply of the atmospheric air containing a water vapor into the process chamber 201 is not performed. As a result, the generation of the by-product gas is suppressed, and the by-product gas can be more reliably removed from the process chamber 201.

(Atmospheric Pressure Restoration Step)

Next, the APC valve 243 is controlled to set the pressure in the process chamber 201 to the atmospheric pressure. At this time, at least one, preferably all, of the valves 314, 324 and 334 are opened to supply an inert gas into the process chamber 201 from at least one of the gas supply pipes 310, 320 and 330. Thereafter, the pressure in the process chamber 201 is returned to the atmospheric pressure (atmospheric pressure restoration) while the inert gas is used as the atmosphere inside the process chamber 201.

At this time, the supply flow rate of the inert gas controlled by the MFCs 314, 324 and 334 is set to a predetermined flow rate higher than the supply flow rate of the inert gas controlled by the MFCs 314, 324 and 334 in the temperature lowering step and the purging step described above.

Also in this step, the purging with the inert gas may be continued by continuing the exhaust from the exhaust pipe 231 at a low exhaust speed (slow exhaust). At this time, the valve 544 may be opened at the same time to supply the atmospheric air into the process chamber 201. Thus, the halogen element remaining in the process chamber 201 can be deactivated for a longer time, and the amount of the halogen element remaining in the process chamber 201 can be further reduced.

(Boat Unloading)

While maintaining the pressure in the process chamber 201 at the atmospheric pressure, the boat elevator 115 lowers the seal cap 219 to open the lower end of the manifold 209. Then, the empty boat 217 is unloaded from the lower end of the manifold 209 to the outside of the reaction tube 203 (boat unloading).

At this time, the valves 314, 324 and 334 are opened to supply the inert gas into the process chamber 201, and the valve 544 is opened to supply the atmospheric air into the process chamber 201. Thus, the concentration of water vapor in the process chamber 201 can be adjusted by the supply flow rate of the inert gas. At this time, the flow rate of the atmospheric air supplied into the process chamber 201 is, for example, 10 slm or more, which is higher than the flow rate of the atmospheric air supplied into the process chamber 201 in the deactivation step described above. For example, the partial pressure of the atmospheric air (or water vapor) in this step is about three times the partial pressure of the atmospheric air (or water vapor) in the deactivation step. Further, for example, the partial pressure of the atmospheric air in the process chamber 201 at this time is set to 50% or more of the total pressure in the process chamber 201. Further, in this step, slow exhaust from the exhaust pipe 231 is performed along with the supply of the inert gas and the atmospheric air.

By supplying the inert gas and the atmospheric air while vacuum-exhausting the inside of the process chamber 201 during boat unloading in this way, the halogen element remaining in the process chamber 201 can be efficiently removed even in the atmospheric pressure state. In addition, when the process chamber 201 is opened, the atmosphere outside the process chamber 201 is preferably composed of the inert gas. However, the atmosphere outside the process chamber 201 may be composed of a gas containing the atmospheric air. Even in this case, by supplying the atmospheric air from the nozzle 420, the atmospheric air (water vapor) can be supplied substantially uniformly to the entire space inside the process chamber 201.

(Atmospheric Pressure Deactivation Step)

After the boat unloading is completed, that is, after the process chamber 201 is opened, the supply of the inert gas and the atmospheric air and the evacuation of the process chamber 201 are continuously performed while maintaining the pressure in the process chamber 201 at the atmospheric pressure. Conditions such as the supply flow rate of the inert gas and the atmospheric air, the speed of exhaust from the exhaust pipe 231, and the like may be the same as those during the boat unloading. By continuing to remove the halogen element remaining in the process chamber 201 even after the process chamber 201 is opened in this way, the amount of the halogen element remaining in the process chamber 201 can be further reduced. Further, by continuously vacuum-exhausting the inside of the process chamber 201, it is possible to continuously remove the by-product gas generated by the reaction between the halogen element and the water vapor contained in the atmospheric air, from the inside of the process chamber 201.

That is, even during the boat unloading and the opening of the process chamber 201, the inert gas and the atmospheric air may be continuously introduced into the process chamber 201 at the same time. Thus, the halogen element remaining in the process chamber 201 can be deactivated for a longer time, and the amount of the halogen element remaining in the process chamber 201 can be further reduced. The partial pressure of the atmospheric air (or water vapor) in the process chamber 201 at this time may be the same as conditions during the boat unloading. In addition, the slow exhaust is continued while the process chamber 201 is opened to the atmospheric pressure. As a result, the amount of the halogen element remaining in the process chamber 201 can be further reduced until the next substrate processing process is started.

Then, before the wafers 200 to be processed are loaded into the process chamber 201 (boat loading), the valve 544 is closed to stop the supply of the atmospheric air, and the inside of the process chamber 201 is purged with an inert gas. In this manner, the wafers 200 to be processed are prevented from being exposed to the atmospheric air in the process chamber 201, which makes it possible to suppress oxidation of the surfaces of the wafers 200.

In addition, after the process chamber 201 is opened, the atmospheric air may be continuously supplied until the wafers 200 to be processed are loaded (boat loading), or may be continuously supplied until the furnace opening is sealed by the seal cap 219. As a result, the halogen element remaining in the process chamber 201 can be deactivated for a longer time, and the residual amount of the halogen element can be further reduced. Thereafter, the film forming process described above is resumed.

(4) Modifications

Next, modifications of the cleaning process and the substrate processing apparatus according to the above-described embodiment will be described in detail. In the following modifications, the points different from the above-described embodiment will be described in detail.

(Modification 1)

Figure 6:
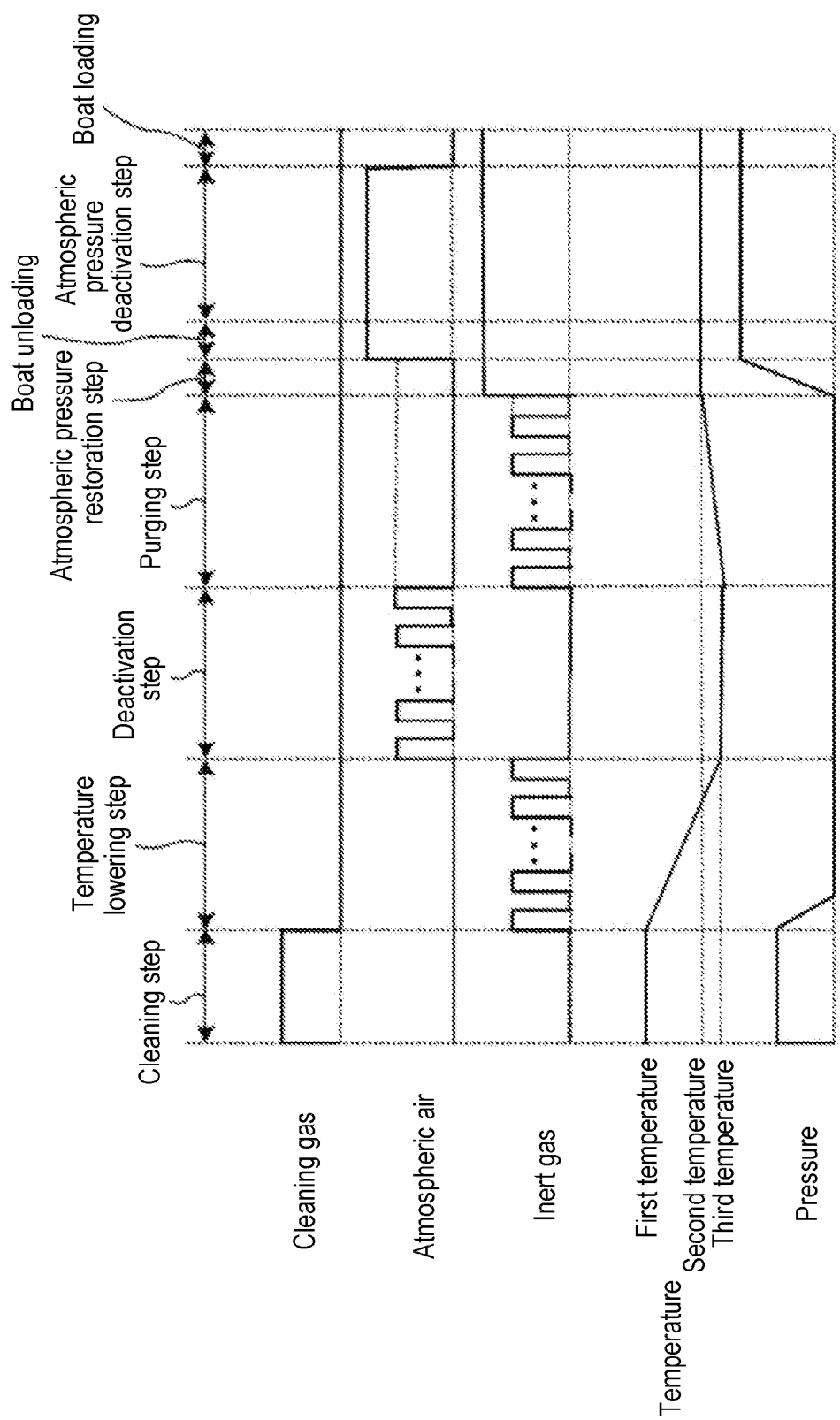
FIG. 6 is a diagram showing a modification of the gas supply timing, the temperature change in the process chamber, and the pressure change in the process chamber in the cleaning process according to one embodiment of the present disclosure.

A modification of the cleaning process according to the above-described embodiment will be described with reference to FIG. 6.

In this modification, the temperature in the process chamber 201 from the temperature lowering step to the purging step differs from that in the cleaning process according to the above-described embodiment. That is, in the above-described temperature lowering step, while vacuum-exhausting the inside of the process chamber 201, purging is performed until, after the end of the cleaning step ends and before the start of the deactivation step, the temperature in the process chamber 201 is lowered from the first temperature to a third temperature (e.g., a predetermined temperature of 100 degrees C. or less) lower than the temperature (process temperature) at which the substrate processing process is performed in the process chamber 201 (temperature lowering). Then, when the inside of the process chamber 201 reaches the third temperature, the deactivation step described above is performed while maintaining the third temperature. After the deactivation step is completed, in the purging step, purging is performed before the start of the next atmospheric pressure restoration step until the temperature in the process chamber 201 is raised from the third temperature to a second temperature, which is a process temperature. By performing the deactivation step after lowering the temperature in the process chamber 201 to the third temperature lower than the process temperature, the amount of the corrosive by-product gas generated by the reaction between the halogen element remaining in the process chamber 201 and the water vapor contained in the atmospheric air can be further reduced as compared with the above-described embodiment. This makes it possible to suppress the corrosion of the in-furnace members while reducing the amount of the halogen element remaining in the process chamber 201.

(Modification 2)

Figure 7:
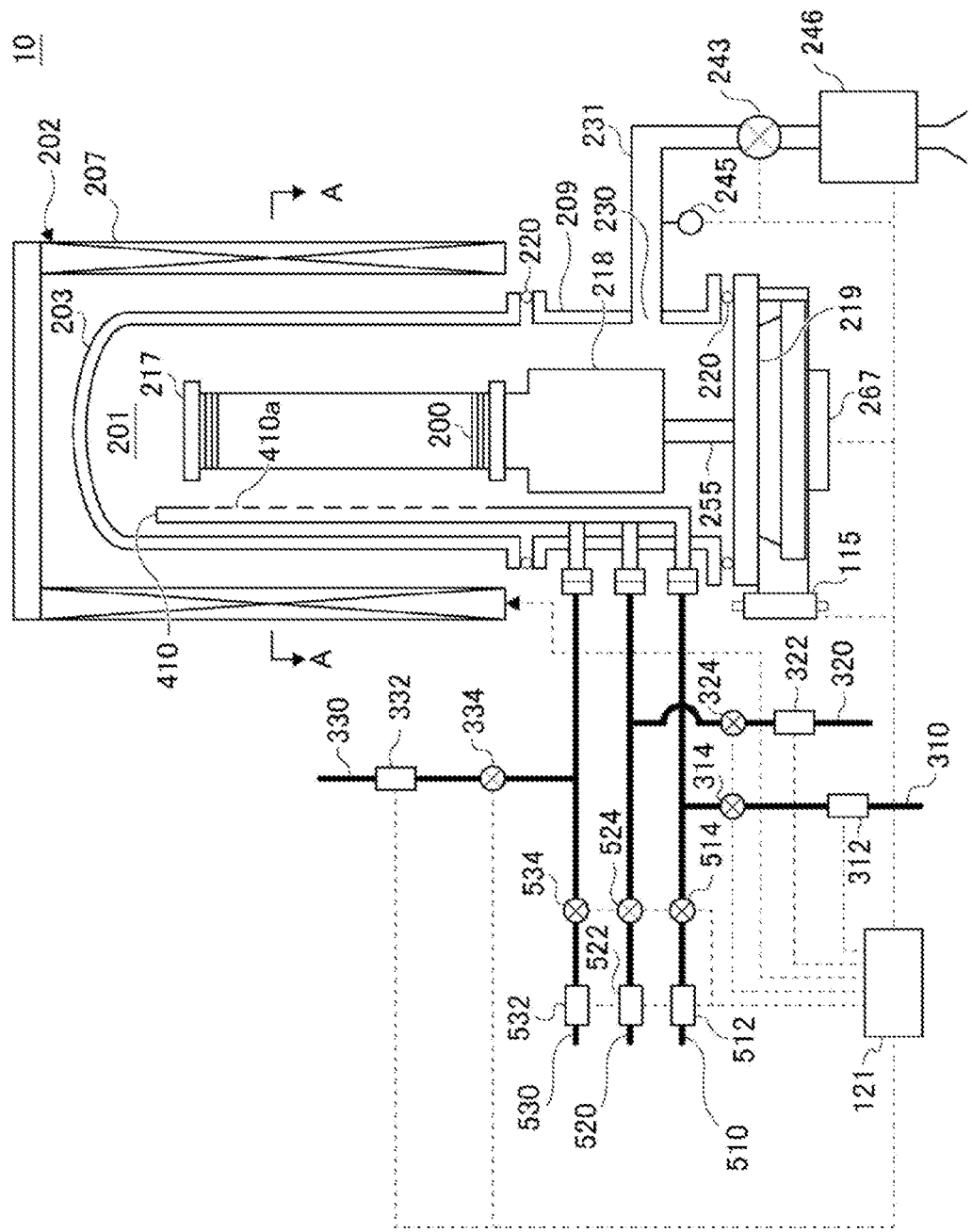
FIG. 7 is a diagram showing a modification of the substrate processing apparatus according to one embodiment of the present disclosure.

Next, a modification of the substrate processing apparatus according to the above-described embodiment will be described with reference to FIG. 7.

In this modification, a water vapor ($H_2O$ gas) is used as the oxygen-containing gas supplied from the gas supply pipe 520 as the reaction gas used for the film-forming process. In this case, an $H_2O$ gas may be used as the gas containing a water vapor used in the deactivation step of the cleaning process. That is, the reaction gas supply system (oxygen-containing gas supply system) may be used as the water vapor-containing gas supply system without providing the atmospheric air supply system (the gas supply pipe 540, the filter 543, the MFC 542 and the valve 544) described above. That is, in the deactivation step, the boat unloading, and the atmospheric pressure deactivation step described above, instead of the atmospheric air, an $H_2O$ gas may be supplied from the gas supply pipe 520 as the gas containing a water vapor. That is, the same supply system as the processing gas supply system that supplies the film-forming gas in the substrate processing process may also be used in the cleaning process. In other words, in the deactivation step, the boat unloading, and the atmospheric pressure deactivation step of the cleaning process, the gas used as the film-forming gas supplied into the process chamber 201 when performing the substrate processing process may be used. Thus, the number of gas supply pipes can be reduced.

(Modification 3)

Figure 8:
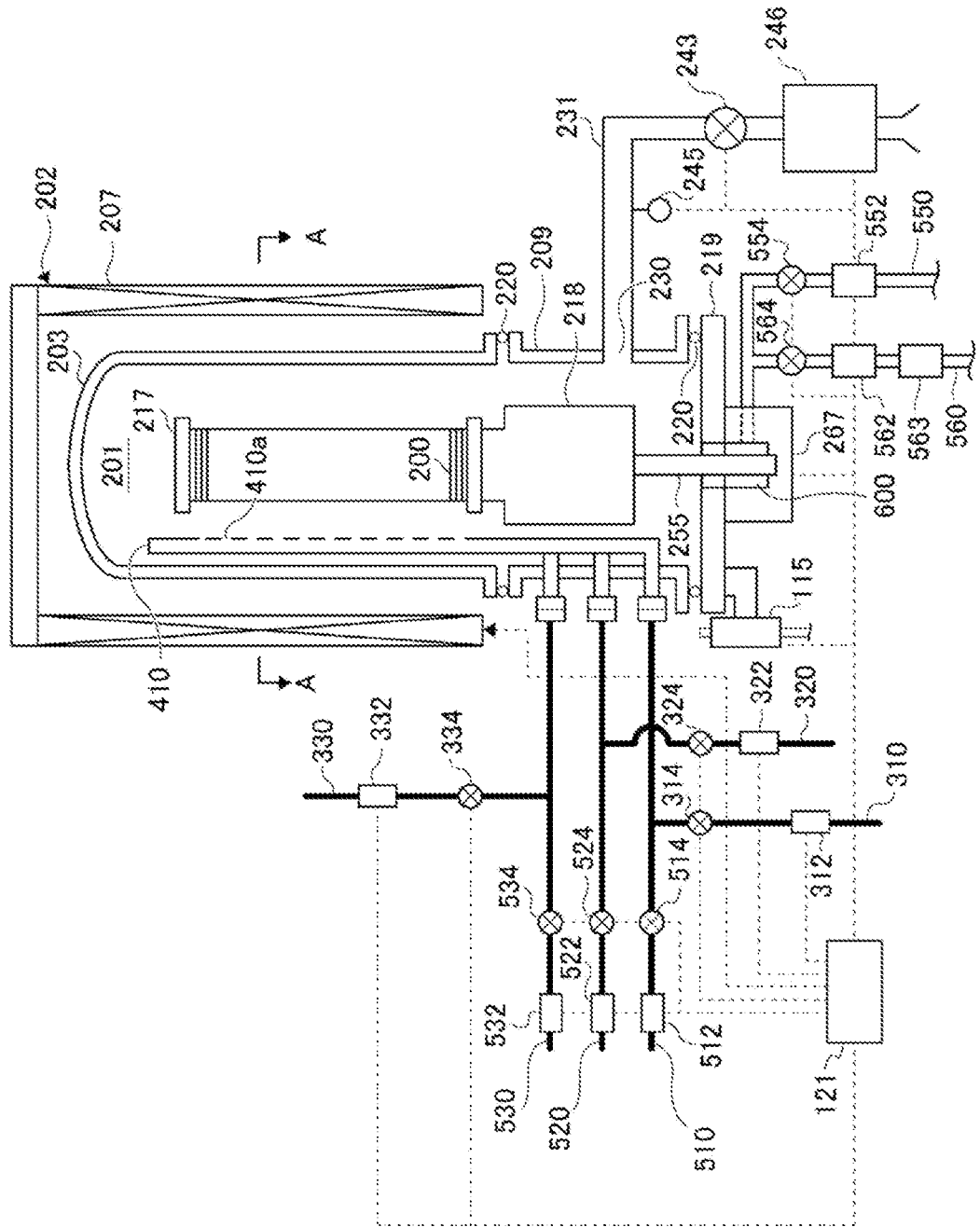
FIG. 8 is a diagram showing another modification of the substrate processing apparatus according to one embodiment of the present disclosure.

Another modification of the substrate processing apparatus according to the above-described embodiment will be described with reference to FIG. 8. In this modification, the supply of the inert gas and the supply of the atmospheric air in the cleaning process described above are performed by using a rotary shaft purge gas supply system that purges the rotary shaft 255 that rotates the boat 217.

A hollow portion 600 is formed around the rotary shaft 255 of the boat 217. The hollow portion 600 is sealed by a magnetic fluid seal, and the upper end thereof is opened into the process chamber 201. A downstream end of a gas supply pipe 550 is connected to the hollow portion 600. On the gas supply pipe 550, an MFC 552 and a valve 554 are installed sequentially from the upstream side of a gas flow. A gas supply pipe 560 is connected to the gas supply pipe 550 on the downstream side of the valve 554. On the gas supply pipe 560, a filter 563, an MFC 562 and a valve 564 are provided sequentially from the upstream side of a gas flow.

From the gas supply pipe 550, an inert gas is supplied into the process chamber 201 through the MFC 552, the valve 554 and the hollow portion 600.

From the gas supply pipe 560, the atmospheric air, which is a gas containing a water vapor, is supplied into the process chamber 201 via the filter 563, the MFC 562, the valve 564, the gas supply pipe 550 and the hollow portion 600.

That is, the inert gas and the atmospheric air are supplied into the process chamber 201 through the hollow portion 600. A rotary shaft purge gas supply system that purges the periphery of the rotary shaft 255 is mainly composed of the gas supply pipe 550, the MFC 552, the valve 554, the gas supply pipe 560, the filter 563, the MFC 562 and the valve 564.

In the cleaning process, while the boat 217 is accommodated in the process chamber 201, the inert gas and the atmospheric air used in the above-described cleaning process are supplied from around the rotary shaft 255 of the boat 217.

That is, in the temperature lowering step, the purging step, the atmospheric pressure restoration step, the boat unloading and the atmospheric pressure deactivation step described above, the inert gas is supplied into the process chamber 201 through the hollow portion 600 by controlling the valve 554. The cycle of supplying the inert gas and stopping the supply of the inert gas is performed a plurality of times. As a result, it is possible to intensively (locally) purge the furnace opening of the process chamber 201 where a gas tends to stay and a halogen element is difficult to remove.

In addition, in the deactivation step, the boat unloading and the atmospheric pressure deactivation step described above, the atmospheric air is supplied from the atmosphere into the process chamber 201 via the filter 563 and the hollow portion 600 by controlling the valve 564. The cycle of supplying the atmospheric air and stopping the supply of the atmospheric air is performed a plurality of times. As a result, it is possible to intensively (locally) deactivate the furnace opening where a gas tends to stay and a halogen element is difficult to remove, and it is possible to reduce the amount of the halogen element remaining in the process chamber 201. In addition to the supply of the inert gas and the atmospheric air through the hollow portion 600, the supply of the inert gas and the atmospheric air (or water vapor) through the nozzle 420 may also be performed in the same manner as in the above-described embodiment and other modifications.

In addition, in the above-described embodiment and modifications, the case where the atmospheric air and the $H_2O$ gas are used as the gas containing a water vapor has been described by way of example. However, the present disclosure is not limited thereto.

Further, in the above-described embodiment, there has been described the case where the cleaning process is performed with the empty boat 217 loaded into the process chamber 201 and the inside of the furnace closed has been described. However, the present disclosure is not limited thereto. The cleaning process may be performed by closing the inside of the furnace with a shutter in a state in which the boat 217 is unloaded from the process chamber 201.

Further, in the above-described embodiment, there has been described the example where the AlO film is formed on the wafer 200 and the AlO film deposited in the furnace is etched (removed) using the cleaning gas. In the present disclosure, the type of film is not particularly limited. In addition, there is no particular limitation on the types of gases used in the film-forming process, such as the precursor gas and the reaction gas and the like, and the cleaning gas.

One embodiment and modifications of the present disclosure have been specifically described above. However, the present disclosure is not limited to the embodiment and modifications described above, and may be modified in various ways without departing from the spirit of the present disclosure.

According to the present disclosure in some embodiments, it is possible to reduce the amount of a halogen element remaining in a process chamber after a cleaning process in a short period of time while suppressing damage to members in the process chamber.

While certain embodiments have been described, these embodiments have been presented by way of example, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method, comprising:
   (a) lowering a temperature in a process chamber supplied with a cleaning gas containing a halogen element while being heated at a first temperature, from the first temperature to a second temperature, while vacuum-exhausting an inside of the process chamber; and
   (b) after (a), supplying a gas containing a water vapor into the process chamber while vacuum-exhausting the inside of the process chamber, to cause the halogen element remaining in the process chamber to react with the water vapor,
   wherein the act of lowering the temperature is performed after substrate processing is performed at a third temperature in the process chamber,
   wherein the second temperature is equal to or lower than the third temperature, and
   wherein in (a), the gas containing the water vapor is not supplied into the process chamber.

2. The cleaning method of claim 1, wherein (a) includes (c) purging the inside of the process chamber by supplying an inert gas into the process chamber while vacuum-exhausting the inside of the process chamber.

3. The cleaning method of claim 1, further comprising:
   (c) after (b), purging the inside of the process chamber by supplying an inert gas into the process chamber while vacuum-exhausting the inside of the process chamber.

4. The cleaning method of claim 1, further comprising:
   (c) after (b), setting a pressure in the process chamber to an atmospheric pressure;
   (d) after (c), opening the process chamber; and
   (e) at least either during execution of (d) or after execution of (d), supplying the gas containing the water vapor into the process chamber while maintaining the pressure in the process chamber at the atmospheric pressure.

5. The cleaning method of claim 1, wherein the gas containing the water vapor is atmospheric air.

6. The cleaning method of claim 1, wherein the gas containing the water vapor is supplied into the process chamber from a gas nozzle installed in the process chamber.

7. The cleaning method of claim 1, wherein (a) and (b) are executed in a state in which a substrate support that supports a substrate in the substrate processing is accommodated in the process chamber, and the gas containing the water vapor is supplied into the process chamber from a purge gas supply system that supplies a purge gas to a hollow portion formed around a rotary shaft that rotates the substrate support.

8. The cleaning method of claim 1, wherein the gas containing the water vapor is atmospheric air taken in from atmosphere via a filter.

9. The cleaning method of claim 1, wherein in (a), the temperature in the process chamber is lowered from the first temperature to a fourth temperature lower than the third temperature.

10. A method of manufacturing a semiconductor device, comprising:
    (h) performing substrate processing in the process chamber;
    (i) supplying the cleaning gas into the process chamber while heating the process chamber to the first temperature; and
    (j) performing the cleaning method of claim 1.

11. The cleaning method of claim 3, wherein in (c), a cycle of supplying the inert gas and stopping the supply of the inert gas is performed a plurality of times.

12. The cleaning method of claim 3, wherein in (c), the gas containing the water vapor is not supplied into the process chamber.

13. The cleaning method of claim 4, wherein after execution of (d), execution of (e) is stopped before a substrate is loaded into the process chamber.

14. The cleaning method of claim 4, wherein after execution of (d), (e) is continuously executed until the process chamber is sealed.

15. The cleaning method of claim 4, wherein in (e), an inert gas is supplied into the process chamber with the gas containing the water vapor.

16. The cleaning method of claim 4, wherein in (e), the inside of the process chamber is continuously evacuated.

17. The cleaning method of claim 13, wherein after execution of (d), (e) is continuously executed until execution of (e) is stopped.

18. A non-transitory computer-readable recording medium storing a program that causes, by a computer, a substrate processing apparatus to perform a process comprising:
    (a) lowering a temperature in a process chamber of the substrate processing apparatus supplied with a cleaning gas containing a halogen element while being heated at a first temperature, from the first temperature to a second temperature, while vacuum-exhausting an inside of the process chamber; and
    (b) after (a), supplying a gas containing a water vapor into the process chamber while vacuum-exhausting the inside of the process chamber, to cause the halogen element remaining in the process chamber to react with the water vapor,
    wherein the act of lowering the temperature is performed after substrate processing is performed at a third temperature in the process chamber,
    wherein the second temperature is equal to or lower than the third temperature, and
    wherein in (a), the gas containing the water vapor is not supplied into the process chamber.

* * * * *